United States Patent
Lemay

(10) Patent No.: US 6,321,074 B1
(45) Date of Patent: Nov. 20, 2001

(54) APPARATUS AND METHOD FOR REDUCING OSCILLATOR FREQUENCY PULLING DURING AM MODULATION

(75) Inventor: Normand T. Lemay, Minneapolis, MN (US)

(73) Assignee: Itron, Inc., Waseca, MN (US)

( * ) Notice: Subject to any disclaimer, the term of this patent is extended or adjusted under 35 U.S.C. 154(b) by 0 days.

(21) Appl. No.: 09/336,912

(22) Filed: Jun. 21, 1999

Related U.S. Application Data

(60) Provisional application No. 60/120,641, filed on Feb. 18, 1999.

(51) Int. Cl.[7] .................................................. H04B 1/06
(52) U.S. Cl. ............................ 455/260; 455/108; 455/75; 455/76; 455/112; 455/118; 455/119; 332/363; 332/127
(58) Field of Search .................................. 455/76, 77, 115, 455/114, 112, 118, 119, 260, 108; 332/363, 127

(56) References Cited

U.S. PATENT DOCUMENTS

| | | |
|---|---|---|
| 4,395,776 * | 7/1983 | Naito et al. ........................... 455/119 |
| 4,570,132 | 2/1986 | Driscoll . |
| 4,593,256 | 6/1986 | Bickley . |
| 4,816,774 * | 3/1989 | Martin ................................... 331/1 A |
| 5,021,754 * | 6/1991 | Shepherd et al. .................... 332/128 |
| 5,055,800 * | 10/1991 | Black et al. .......................... 331/1 A |
| 5,166,647 | 11/1992 | Riebman . |
| 5,268,657 * | 12/1993 | Estrick et al. ......................... 331/75 |
| 5,604,468 * | 2/1997 | Gillig .................................... 331/176 |

* cited by examiner

*Primary Examiner*—Daniel Hunter
*Assistant Examiner*—Alan T. Gantt
(74) *Attorney, Agent, or Firm*—Patterson, Thuente, Skaar & Christensen, P.A.

(57) ABSTRACT

The invention discloses an apparatus and method for reducing frequency pulling. Further, the invention provides amplitude modulation techniques to eliminate spurious signals and injection locking of the VCO to the output transmitted carrier. The architecture includes at least one synthesizer, a plurality of frequency dividers, an output VCO, a low pass filter, a mixer, a pretransmission filter and an amplifier connected in a manner to generate an output frequency which is non-harmonically related to the synthesizer VCO and to maintain the magnitude of the output frequency at, preferably, exactly 1.5 times higher than the VCO frequency.

12 Claims, 1 Drawing Sheet

APPARATUS AND METHOD FOR REDUCING OSCILLATOR FREQUENCY PULLING DURING AM MODULATION

RELATED APPLICATION

This application claims the benefit of U.S. Provisional Application No. 60/120,641, filed Feb. 18,1999.

FIELD OF THE INVENTION

The present invention generally relates to radio frequency signal modulation. More specifically, the present invention relates to attenuation of oscillator frequency pulling. Specifically, the invention provides a non-harmonically related frequency scheme to significantly reduce frequency pulling during amplitude modulation of the transmit power with data. More specifically, the invention pertains to the elimination of injection locking between a voltage controlled oscillator (VCO) and an output signal by preferably generating a non-harmonic relationship between the VCO and the output signal.

BACKGROUND OF THE INVENTION

The technique for converting signals to modulate amplitude is well known. Signals may be conditioned or enhanced. Signal conditioning is the process of modifying or adapting a signal to match a specific purpose. For example, a typical system in which signals are conditioned includes the detection and filtering of an alternating-current wave for indirect voltage measurement using a direct current meter. Another example is the implementation of an equalizer in a high-fidelity system. Signal enhancement relates to a process in which the quality of decipherabilty of a signal is improved. For example in radio-frequency (RF) receivers, signal enhancement is implemented to optimize the signal-to-interference ratio. Further, in high-fidelity audio receivers, signal enhancement is used to reduce noise and adapt the sound to a listener's preferences.

Signal processing also utilizes modulation techniques to condition signals. Generally, modulation techniques implement a synthesizer to generate a desired signal. Modulation in general refers to the process of changing the characteristics of an electromagnetic wave in a manner to convey communication or other intelligence. Several difficult aspects of modulation are encountered in the art when more data are required at a rate higher than that allowed by normal modulation.

Traditionally, in order to transfer signals at a high rate of speed, modulation based signal processing techniques employ various complex systems such as up conversions, several filters, synthesizers and oscillators. These systems, to a large extent, encounter frequency pulling and are prone to unreliable and distorted signal output. Specifically, spurious responses from mixing devices contribute to output signal corruptions. Further, prior art systems require significant modifications and upgrade for integration with other multichannel data command units specially if frequency pulling is anticipated. Many synthesized radio units, which implement amplitude modulation, require a better and efficient topology to overcome the aforementioned problems and also to transmit the information contained in the signals at high fidelity and quality.

FIG. 1 is a prior art schematic representing a circuit implemented to reduce frequency pulling. The circuit includes a reference signal source 10 which is connected to a plurality of frequency dividers 11. The output from each frequency divider 11 is fed into phase detectors 12. Each phase detector 12 is connected to low units, which implement amplitude modulation, require a better and efficient pass filter (LPF) 13 on the output side. LPFs 13 are then connected to VCO1 15a and VCO2 15b, respectively. The VCOs, 15a, 15b produce frequencies which are fed into mixer 16. A portion of VCO1 15a and VCO2 15b output is fed back into phase detectors 12 via frequency dividers 14. The output from mixer 16 is directed to pre-transmission filter 17. Thereafter, the signal is directed through amplifier 18 to antenna 19. The frequency output at antenna 19 is a sum and or difference of the frequency outputs from VCO1 15a and VCO2 15b.

The prior art utilizes up and down conversion of the signal source to reach an intermediate frequency (IF). The IF is the output frequency from the mixer stage. High gain and only moderate selectivity can be obtained because the high Q factor required on the filters due to the high upconverted frequency.

One of the many limitations of the prior art is that the architecture for reducing carrier frequency pulling is very complex. Specifically, the scheme requires several filters, oscillators and mixers to eliminate spurious and non-related harmonics from the transmitter. However, these components generate local interferences, both individually and in combinations, which further distort the information carried in the signal and the output frequency.

Accordingly there is a need to provide a reliable and efficient circuit to attenuate oscillator frequency pulling including elimination of spurious and providing related harmonic isolation from the output of an amplitude modulated VCO. It turns out that output frequencies which are harmonically related to either VCO1 or VCO2 (15A or 15B) tend to also pull the VCO's frequency as well.

SUMMARY OF THE INVENTION

It is an object of the present invention to provide apparatus and a method in which frequency pulling is significantly eliminated in an output VCO which output is a result of AM modulation. The output frequency is structured to be larger than the synthesizer VCO frequency by a rational (non-integer) factor greater than unity, thus maintaining a non-harmonic relationship between the output VCO and the synthesizer.

Another object of the present invention is to eliminate spurious responses. Spurious responses in a transceiver can take place as a result of mixing between two or more external signals. By making the output exactly 1.5 times the VCO, the mixing spurious which results will lie exactly on the desired carrier, as it applies only in this case.

It is a further object of the invention to provide a scheme in which a synthesizer, a plurality of frequency multipliers, an output VCO, a low pass filter, a mixer, a pretransmission filter and a transmitter are connected in a manner to generate an output frequency which is non-harmonically related to the synthesizer VCO during an AM modulation of the output VCO, in order to avoid frequency pulling of the synthesizer's VCO.

Yet another object of the invention is to provide an AM modulation scheme in which the frequency pulling is substantially reduced. Generally, AM modulation involves a process by which voices and other signals are impressed onto a carrier signal.

It is a further object of the invention to provide a frequency pulling reduction architecture implemented in an AM modulation process wherein spurious response resulting from mixing products are eliminated. The architecture allows for a single synthesizer promoting lower cost and a smaller number of parts.

It is still a further object of the invention to provide a non-harmonic frequency plan to enable a VCO to run at a lower frequency and thereby implement larger value filters and mixers, for example, which are less sensitive to board parisitics and are further easier to tune with less beads, shielding and bypassing.

With these and other objects, advantages and features of the invention that may become hereinafter apparent, the nature of the invention may be more clearly understood by reference to the following detailed description of the invention, the appended claims, and several drawings herein.

BRIEF DESCRIPTION OF THE DRAWINGS

In the drawings, wherein like numerals describe like components throughout the several views.

DETAILED DESCRIPTION OF THE DRAWINGS

The implementation of the present invention encompasses a number of applications in which radio frequency signal modulation is required. Specifically, the invention is advantageously implemented to replace complex filter architectures including synthesizers and oscillators which are needed to eliminate oscillator frequency pulling.

Figure 1:
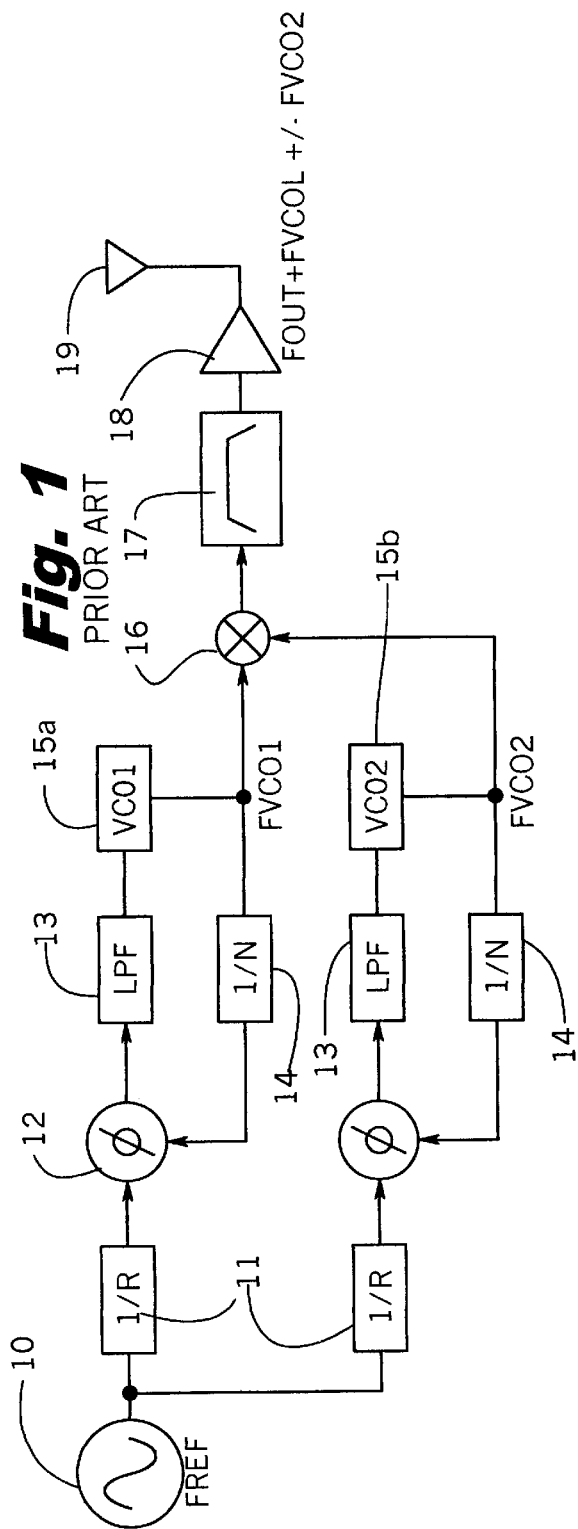
FIG. 1 is a prior art schematic representing a signal processing system implemented to attenuate frequency pulling.
Figure 2:
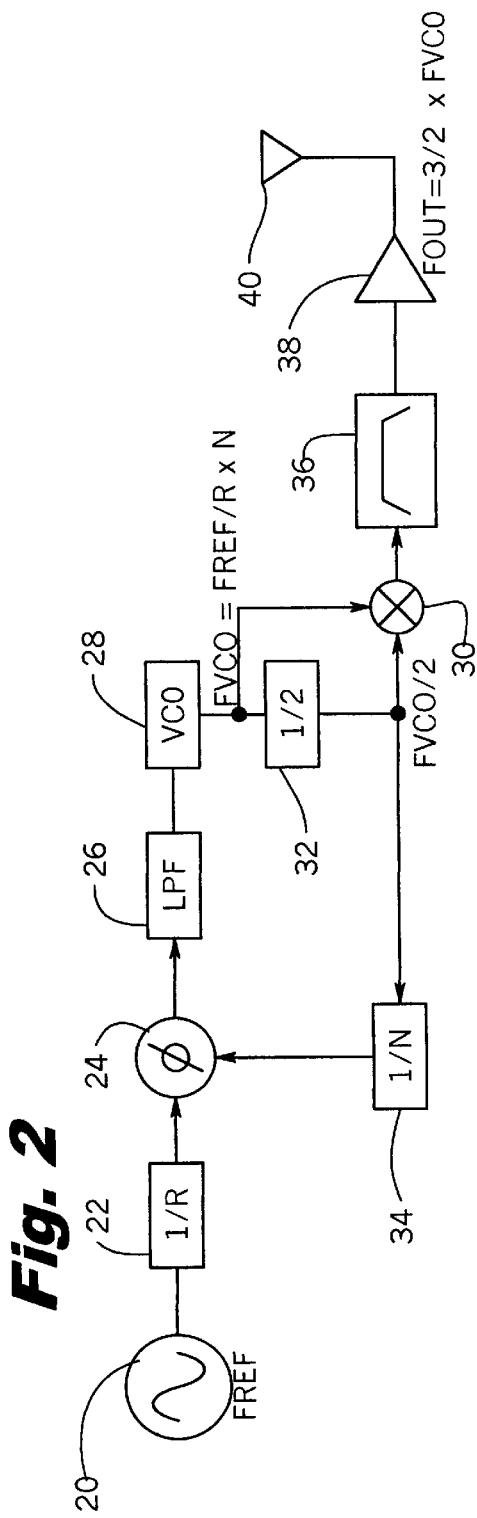
FIG. 2 is a schematic representing a high level integration of the major components in accordance with the present invention.

FIG. 2 represents an integrated scheme of the present invention. Preferably, a signal from signal source 20 is modified via frequency divider 22 which directs the modified signal to phase detector 24. Phase detector 24 compares the signal and directs it to LPF 26 where the frequency is conditioned and further directed to VCO 28. VCO 28 is a voltage controlled oscillator and produces a frequency equal to frequency source 20 modified by a factor. The output frequency from VCO 28 is directed to mixer 30 and as well to frequency divider 32. Frequency divider 32 directs the output frequency to frequency divider 34 from where it is directed into phase detector 24. Further, on the output side of mixer 30, the output frequency is directed to pretransmission filter 36. Finally the output frequency is directed from pre-transmission filter 36 into amplifier 38. The resulting output frequency is 1.5 times VCO 28 frequency and is directed to antenna 40 for transmission.

One of the significant aspects of the present invention depicted in the embodiment of FIG. 2 includes the elimination of dual synthesized local oscillators. This is implemented to reduce frequency pulling. Specifically the architecture utilizes a unique circuit in which multipliers are coupled to multiply VCO 28 output frequency to yield a frequency output exactly 1.5 times higher than VCO 28 output frequency to ensure a non-harmonic relationship therebetween.

Accordingly, the overall system of the invention allows the output frequency of the transmitter's power amplifier to be non-harmonically related to the VCO. Typically, large signal power will couple back to the VCO and injection lock the VCO and skew the oscillation frequency (frequency pulling). This phenomenon can occur with radiated or conducted coupling due to proximity of the power amplifier to the VCO and can also occur due to impedance variations seen by the VCO when the Power Amplifier is AM modulated. Impedance variations at the VCO output usually occur during the on/off switching of the Power Amplifier during AM Modulation and can be significantly large if the Power Amplifier is harmonically related to the VCO. The method, in accordance with the present invention, reduces the likelihood of frequency pulling due to injection locking or impedance variations because of the fact that the output frequency is non-harmonically related. This method may be employed whenever frequency pulling is of concern (whether the system is a transmitter or only a modulator) and significantly reduces the component costs by utilizing only one synthesizer and a low Q filter (since all of the undesired spurious due to the upconverter lie on top of the desired signal and is therefore non-degenerating of performance).

Although the present invention has been shown and described with respect to preferred embodiments, various changes and modifications could be made that are obvious to a person skilled in the art to which the invention pertains even if not shown or specifically described herein, are deemed to lie within the spirit and scope of the invention and the following claims.

What is claimed is:

1. Apparatus for reducing frequency pulling of an output VCO involving AM modulation wherein the output frequency is structured to be larger than a synthesizer VCO frequency by a factor greater than unity to maintain a non-harmonic relation between the synthesizer and the output VCO, the apparatus comprising:

a source for signals;

the synthesizer for synthesizing said signals being in communication with a first frequency divider;

a second frequency divider connected to the output VCO;

a third frequency divider connected to said second frequency divider and further connected to said synthesizer;

a mixer connected to the transmission side of the output VCO and further connected to the transmission side of said second frequency divider;

a pretransmission filter connected to said mixer on the transmission side; and an amplifier connected to the pretransmission filter and further connected to a transmitter;

the output frequency at said amplifier being non-harmonically related to the synthesizer VCO to thereby minimize frequency pulling during the AM modulation of the output VCO.

2. The apparatus of claim 1, wherein said mixer is structured to accept about 100% of the frequency from the output VCO and further accept a frequency input equal to about 50% of the output VCO.

3. The apparatus of claim 1, wherein said third frequency divider is structured to distribute $$\frac{1}{N} \times 50\%$$

of the frequency from the output VCO to the phase detector.

4. A frequency pulling reduction architecture implemented in an AM modulation process wherein spurious responses resulting from mixing products are eliminated, the architecture comprising:

a frequency transmitter scheme having a 3/2 frequency output;

a frequency synthesizer; and said frequency output being developed from a VCO for both said transmitter and being non-harmonically related to a VCO frequency of said synthesizer.

5. The architecture according to claim 4, wherein said transmitter scheme includes a frequency source and a frequency divider.

6. The architecture according to claim 4, wherein said frequency synthesizer is coupled to a plurality of conditioned frequencies at the input side and a low pass filter at the output side.

7. The architecture according to claim 4, wherein said 3/2 frequency output comprises conditioned frequencies from a frequency source and said VCO.

8. A method of reducing frequency pulling in an AM modulation process wherein spurious responses resulting from mixing devices are eliminated, the method comprising the steps of:

generating a VCO output frequency equal to a value obtained from a source frequency conditioned by a plurality of frequency dividers and phase detectors;

introducing said VCO output into a mixer;

adding ½ of said VCO output into said mixer via one of said frequency dividers;

introducing ½ of said VCO output into said synthesizer via one of said plurality of frequency dividers; and producing a frequency output equal to 1.5 times greater than said VCO output frequency at an output amplifier.

9. The method according to claim 8, wherein said step of introducing ½ of said VCO output into said synthesizer includes the step of apportioning ½ of said VCO frequency using a ½ frequency divider to generate an output frequency equal to ½ the VCO frequency ($F_{VCO}$).

10. The method according to claim 9, wherein said step of apportioning includes the step of directing ½ of the $F_{VCO}$ into two opposite directions wherein one of the opposite directions feeds into a mixer.

11. The method according to claim 10, wherein said step of directing includes introducing ½ of the $F_{VCO}$ into a divider which ultimately feeds into the phase detector.

12. The method according to claim 8, wherein said step of producing a frequency output includes mixing output frequencies of $F_{VCO}$ and ½ $F_{VCO}$ in a mixer to generate a frequency output equal to 3/2 $F_{VCO}$.

* * * * *